(12) United States Patent
Chu et al.

(10) Patent No.: US 12,008,181 B2
(45) Date of Patent: Jun. 11, 2024

(54) ELECTRONIC DEVICE AND CONTROL METHOD THEREOF

(71) Applicant: AUO Corporation, Hsin-Chu (TW)

(72) Inventors: Chia-Hsien Chu, Hsin-Chu (TW); Chun-Chi Lai, Hsin-Chu (TW); Ching-Sheng Cheng, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 24 days.

(21) Appl. No.: 17/938,992

(22) Filed: Sep. 7, 2022

(65) Prior Publication Data

US 2023/0236685 A1 Jul. 27, 2023

(30) Foreign Application Priority Data

Jan. 24, 2022 (TW) .................................. 111103009

(51) Int. Cl.
*G06F 3/041* (2006.01)
*H03K 19/20* (2006.01)

(52) U.S. Cl.
CPC .......... *G06F 3/0412* (2013.01); *G06F 3/0416* (2013.01); *H03K 19/20* (2013.01)

(58) Field of Classification Search
CPC ...... G06F 3/0412; G06F 3/0416; H03K 19/20
See application file for complete search history.

(56) References Cited

U.S. PATENT DOCUMENTS

| 8,471,804 | B2 | 6/2013 | Wu et al. | |
| 11,829,553 | B2 * | 11/2023 | Xiao | ..................... G06F 1/3262 |
| 2013/0222270 | A1 | 8/2013 | Winkler et al. | |
| 2022/0066612 | A1 * | 3/2022 | Xiao | ..................... G06F 1/3206 |

FOREIGN PATENT DOCUMENTS

| CN | 104272711 A | 1/2015 |
| TW | 201351113 A | 12/2013 |
| TW | I738311 B | 9/2021 |

OTHER PUBLICATIONS

"Gate Universality", All About Circuits, from Wayback Machine capture dated Jun. 13, 2015 (Year: 2015).*

* cited by examiner

*Primary Examiner* — Peter D McLoone
(74) *Attorney, Agent, or Firm* — WPAT, PC

(57) ABSTRACT

The disclosure provides an electronic device including a host control circuit, a display driving circuit, a touch driving circuit and a logic circuit. The host control circuit is configured to provide a first reset control signal. The display driving circuit is configured to reset according to the first reset control signal. The logic circuit is configured to generate a second reset control signal to the touch driving circuit according to the first reset control signal and an enable signal. During a sleep mode of the electronic device, the enable signal has a first logic level. In response to the enable signal at the first logic level, the logic circuit generates the second reset control signal at the first logic level. The touch driving circuit does not reset according to the second reset control signal at the first logic level.

20 Claims, 5 Drawing Sheets

ELECTRONIC DEVICE AND CONTROL METHOD THEREOF

CROSS-REFERENCE TO RELATED APPLICATION

This application claims priority to Taiwan Application Serial Number 111103009, filed Jan. 24, 2022, which is herein incorporated by reference in its entirety.

BACKGROUND

Field of Invention

The present invention relates to an electronic device. More particularly, the present invention relates to an electronic device includes touch sensing functions.

Description of Related Art

To reduce the power consumption of a wearable device, a standby mode or a deep standby mode is adopted in the wearable device. However, if the wearable device is frequently triggered and activated to wake-up the device from the standby mode, such as, user may often clicks a touch-screen of a smart watch to check time, it may cause the operation mode frequently changes between the standby mode and the active mode, which may increase the power consumption. Therefore, how to reduce the power consumption of the wearable device is an important issue in this field.

SUMMARY

To achieve the aforesaid purpose, one aspect of the present disclosure is related to an electronic device. The electronic device includes a host control circuit, a display driving circuit, a touch driving circuit and a logic circuit. The host control circuit is configured to provide a first reset control signal. The display driving circuit is configured to perform a reset operation according to the first reset control signal. The logic circuit is configured to generate a second reset control signal to the touch driving circuit according the first reset control signal and an enable signal. In a sleep mode, the enable signal has a first logic level, in response to the enable signal being at the first logic level, the logic circuit generates the second reset control signal at the first logic level, and the touch driving circuit does not reset according to the second reset control signal at the first logic level.

Another aspect of the present disclosure is related to an electronic device. The electronic device includes a host control circuit and a touch with display driver integration circuit. The host control circuit is configured to provide a first reset control signal. The touch with display driver integration circuit includes a display driving circuit, a touch driving circuit and a logic circuit. The display driving circuit is configured to perform a reset operation according to the first reset control signal. The logic circuit is configured to generate a second reset control signal, according to the first reset control signal and an enable signal, to the touch driving circuit. In a sleep mode of the electronic device, the enable signal has a first logic level, in response to the enable signal being at the first logic level, the logic circuit generates the second reset control signal at the first logic level according to the enable signal, wherein the touch driving circuit does not reset according to the second reset control signal at the first logic level.

The other aspect of the present disclosure is related to a control method. The control method includes the following steps. A first reset control signal is provided by a host control circuit. An enable signal is provided by a digital circuit. In an active mode, a second reset control signal is generated an outputted to a touch driving circuit, by a logic circuit according to a logic level of the first reset control signal, and the touch driving circuit is reset according to the second reset control signal corresponding to the logic level of the first reset control signal. In a sleep mode, the second reset control signal is generated and outputted to the touch driving circuit, by the logic circuit according to a logic level of the enable signal.

Summary, the present utilizes the logic circuit to generate the second reset control signal according to the first reset control signal and an enable signal, and the touch driving circuit is triggered to perform the reset operation according to the second reset control signal in the active mode. In the sleep mode, the touch driving circuit does not to perform the reset operation according to the second reset control signal, so as to reduce the power consumption of the electronic device.

BRIEF DESCRIPTION OF THE DRAWINGS

The present invention can be more fully understood by reading the following detailed description of the embodiment, with reference made to the accompanying drawings as follows.

DETAILED DESCRIPTION

Figure 1:
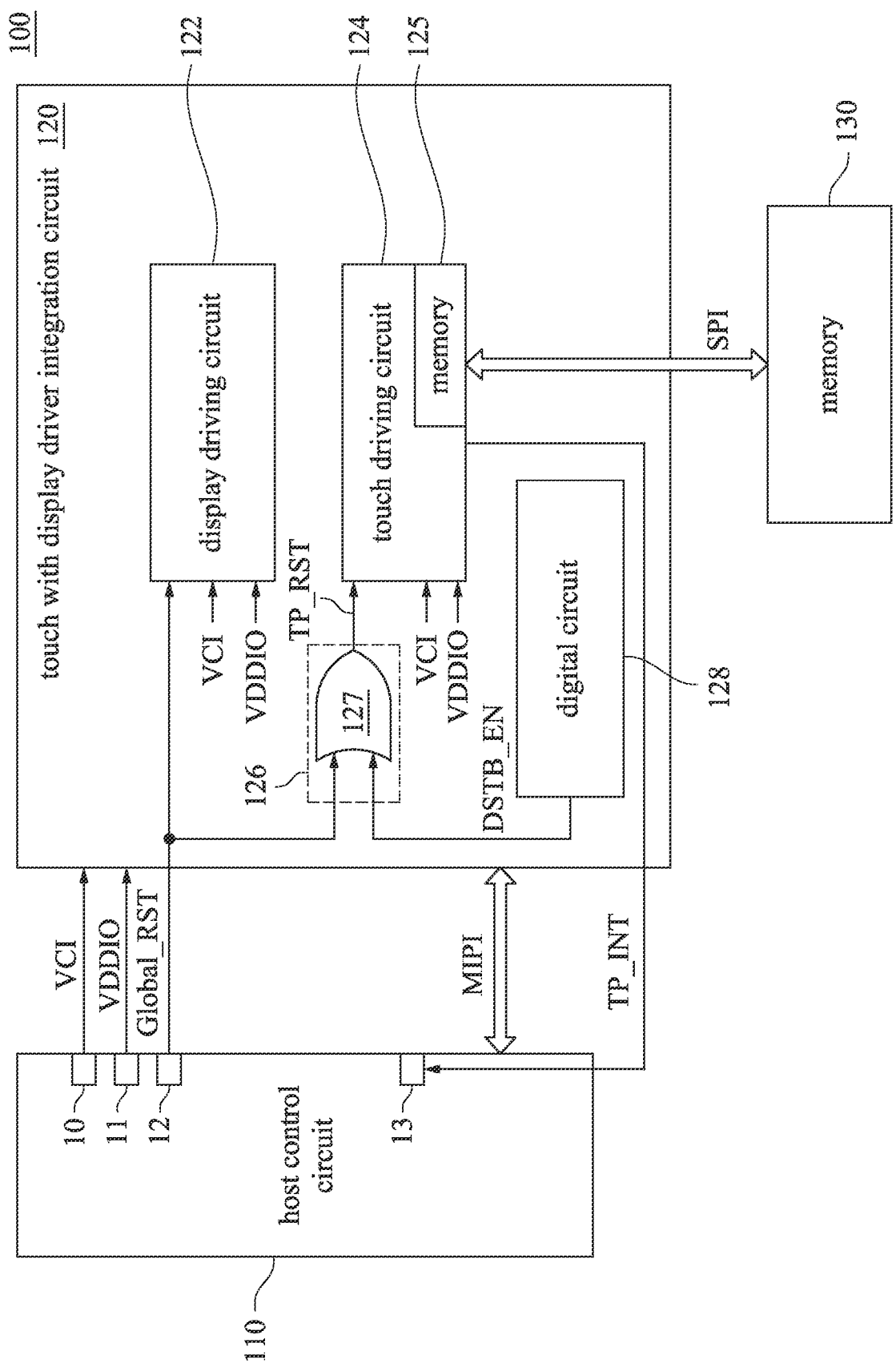
FIG. 1 is a schematic diagram of a function block of an electronic device in accordance with one embodiment of the present disclosure.

Reference is made to FIG. 1. FIG. 1 is a schematic diagram of a function block of an electronic device 100 in accordance with one embodiment of the present disclosure. As shown in FIG. 1, the electronic device 100 includes a host control circuit 110, a touch with display driver integration circuit 120 and a memory 130. In some embodiments, the electronic device 100 can be implemented by a wearable electronic device, such as, the smart watch, the smart bracelet, the smart headphone, the smart clothing, the smart glass, the smart ring or other smart electronic device. In other embodiments, the electronic device 100 can be implemented by tablet computer, notebook, touch panel or other computer device.

In some embodiments, the host control circuit 110 can be implemented by microprocessor, processor or other processing circuit. In some embodiments, the touch with display driver integration circuit 120 can be implemented by the touch with display driver integration chip. The aforesaid touch with display driver integration chip incorporates the functions for a touch sensing driver and a display driver. In some embodiments, the touch sensing driver is configured to drive the touch sensing sensor, and the display driver is configured to drive the display.

In some embodiments, the memory 130 can be implemented by a NOR flash. In other embodiments, the memory 130 can be implemented by a NAND flash, flash memory or other memory. Therefore, it is not intended to limit the present disclosure.

In structure, the host control circuit 110 is electrically coupled to the touch with display driver integration circuit 120. In function, the host control circuit 110 is configured to generate and output the first supply voltage VDDIO and the second supply voltage VCI. In some embodiments, the first supply voltage VDDIO can be considered as the supply power provided for the digital circuit included in the touch with display driver integration circuit 120, and the second supply voltage VCI can be considered as the supply power provided for the analog circuit included in the touch with display driver integration circuit 120.

In some embodiments, the host control circuit 110 communicates with the touch with display driver integration circuit 120 through the mobile industry processor interface MIPI. In other embodiments, the host control circuit 110 can communicate with the touch with display driver integration circuit 120 through serial peripheral interface, inter-integrated circuit or other interface. Therefore, it I not intended to limit the present disclosure.

In some embodiments, the mobile industry processor interface MIPI is compatible with the display command set, the host control circuit 110 can instruct the touch with display driver integration circuit 120 to drive the display and the touch sensing sensor to operate in an active mode or a sleep mode according to commands included in the display command set.

For example, in the active mode, the touch with display driver integration circuit 120 drives the display to display image, and drives the touch sensing sensor to operate at a touch sampling rate of 90 Hz. On the other hand, in the sleep mode, the touch with display driver integration circuit 120 enters into the low power mode, such that the display will not display the image, and the touch sensing sensor may operate at a touch sampling rate of 11 Hz. Meanwhile, the pins 10 and 11 of the host control circuit 110 connected to the touch with display driver integration circuit 120 are powered on.

In structure, the touch with display driver integration circuit 120 is electrically coupled to the memory 130. In some embodiments, the touch with display driver integration circuit 120 can communicate with the memory 130 through the serial peripheral interface SPI. In other embodiments, the touch with display driver integration circuit 120 can communicate with the memory 130 through other interface. Therefore, it is not intended to limit the present disclosure.

In some case, the touch with display driver integration circuit in the wearable device performs a reset operation according to a reset control signal, and the reset control signal triggers the wearable device to perform reset operation when the operation mode of the wearable device is switched from the sleep mode to the active mode. If the operation mode of the wearable device is frequently switched form the sleep mode to the active mode, which may cause the unnecessary of reset operation for the touch with display driver circuit, resulting in a large amount of power consumption. Therefore, the electronic device 100 controls a part of circuits included in the touch with display driver integration circuit 120 to not perform the reset operation during the appropriate time period. The electronic device 100 how to control the part of circuits included in the touch with display driver integration circuit 120 to not perform reset operation will be described in detail in the following embodiments.

In some embodiments, the touch with display driver integration circuit 120 includes a display driving circuit 122, a touch driving circuit 124, a logic circuit 126 and a digital circuit 128. In some embodiments, the display driving circuit 122 can be implemented by display driver for driving the display, and the touch driving circuit 124 can be implemented by touch sensor driver for driving the touch sensor. In the embodiment of the electronic device 100, the logic circuit 126 can be implemented by single logic gate, such as the OR gate 127 as shown in FIG. 1.

In some embodiments, the first supply voltage VDDIO can be considered as the supply power providing for digital circuits included in the display driving circuit 122 and the touch driving circuit 124, and the second supply voltage VCI can be considered as the supply power providing for the analog circuits included in the display driving circuit 122 and the touch driving circuit 124.

In structure, the pins 10, 11 and 12 are electrically coupled to the display driving circuit 122 and the touch driving circuit 124 included in the touch with display driver integration circuit 120. In function, the host control circuit 110 outputs the first supply voltage VDDIO through the pin 11 to the display driving circuit 122 and the touch driving circuit 124 included in the touch with display driver integration circuit 120, and the host control circuit 110 outputs the second supply voltage VCI through the pin 10 to the display driving circuit 122 and the touch driving circuit 124 included in the touch with display driver integration circuit 120.

And, the host control circuit 110 generates a first reset control signal Global_RST, and the host control circuit 110 outputs the first reset control signal Global_RST through the pin 12 to first terminals of the display driving circuit 122 and the logic circuit 126. The first reset control signal Global_RST is configured to trigger the display driving circuit 122 to perform the reset operation.

The digital circuit 128 is configured to generate an enable signal DSTB_EN, and output the enable signal DSTB_EN to a second terminal of the logic circuit 126. The enable signal DSTB_EN can be implemented by the status value for the current state or operation mode of the electronic device 100. In some embodiments, the enable signal DSTB_EN can be considered as the status value for the active mode and the deep stand-by mode. For example, in the active mode of the electronic device 100, the enable signal DSTB_EN has a low logic level. On the other hand, in the sleep mode or the deep stand-by mode of the electronic device 100, the enable signal DSTB_EN has a high logic level.

The logic circuit 126 generates a second reset control signal TP_RST, according to the first reset control signal Global_RST and the enable signal DSTB_EN, and output the second reset control signal TP_RST to the touch driving circuit 124.

Specifically, in response to one/at least one of the first reset control signal Global_RST and the enable signal DSTB_EN being at a high logic level, the OR gate 127 outputs the second reset control signal TP_RST being at the high logic level, and in response to both of the first reset control signal Global_RST and the enable signal DSTB_EN at a low logic level, the OR gate 127 outputs the second reset control signal TP_RST at the low logic level to the touch driving circuit 124.

The touch driving circuit 124 includes a memory 125. In some embodiments, the memory 125 can be implemented by phase-change random access memory or other volatile memory. In an initial process or a reset process, the touch driving circuit 124 reads the firmware program of the touch driving circuit 124 from the memory 130, and stores the aforesaid firmware program to the memory 125. As a result, the touch driving circuit 124 accesses the firmware program in the memory 125 to perform the touch sensing functions. In other modes, if the supply power does not been supplied to the touch driving circuit 124, the data stored in the memory will disappear, and this the touch driving circuit 124 need to read the firmware program from the memory 130 during the initial process, and then store the said firmware program to the memory 125 again.

When the operation mode of the wearable device is frequently switched between the sleep mode and the active mode, if the touch driving circuit is power on that the supply power is still supplied to the touch driving circuit, the reset control signal will trigger the touch driving circuit to perform the reset operation to read the firmware program form the memory. However, a read current causing from reading the firmware program by the touch driving circuit results in a large amount of power consumption. For better understanding, how to utilize the electronic device 100 during the appropriate time periods, reference is made to FIG. 2.

Figure 2:
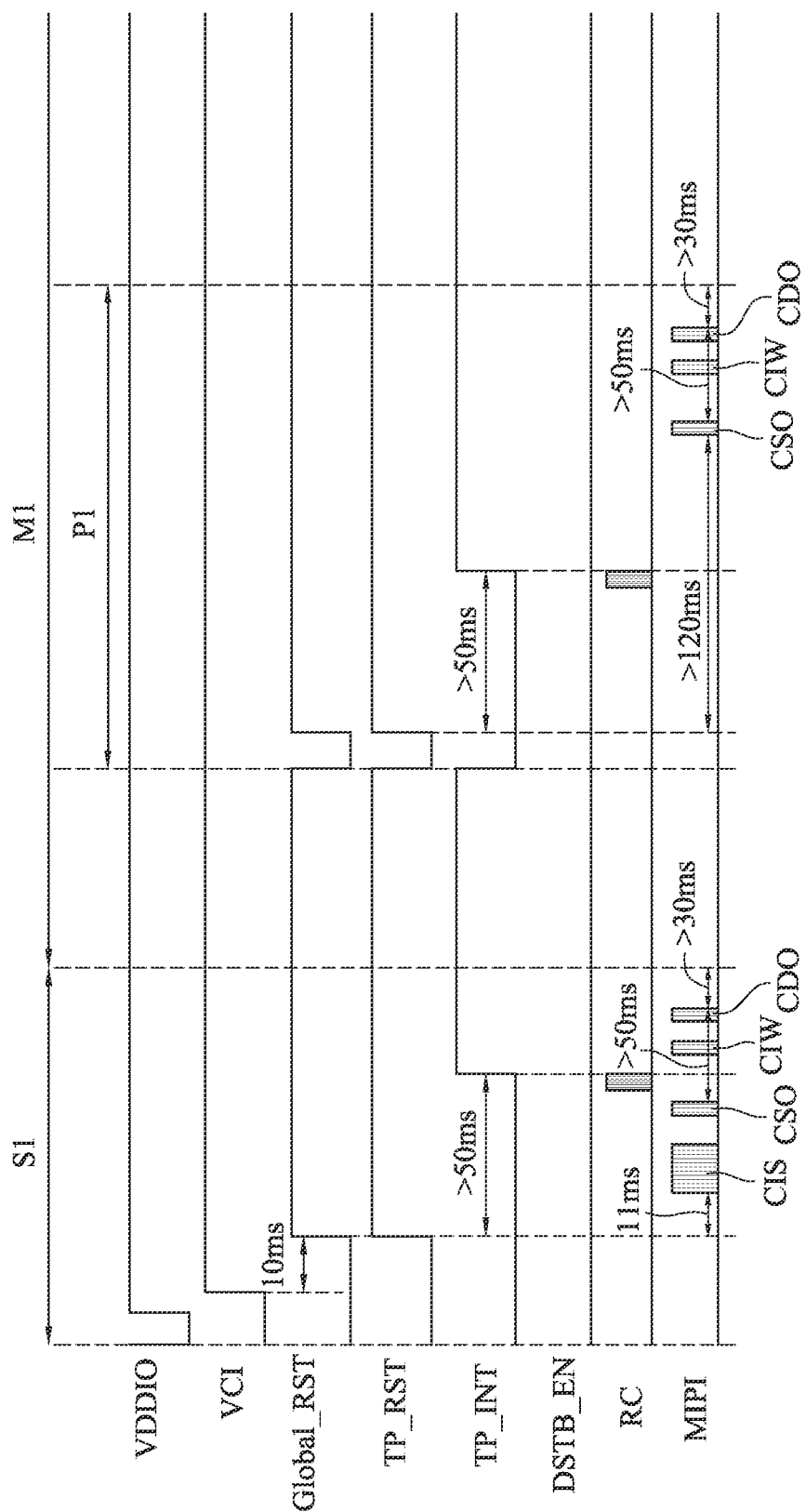
FIG. 2 is a schematic diagram of a timing diagram of the electronic device of the embodiment in FIG. 1 during an initial process and an active mode in accordance with one embodiment of the present disclosure.

FIG. 2 is a schematic diagram of a timing diagram of the electronic device 100 of the embodiment in FIG. 1 during an initial process S1 and an active mode M1 in accordance with one embodiment of the present disclosure. During the initial process S1, the electronic device 100 performs the power on process. During a reset period P1 in the active mode M1, the touch with display driver integration circuit 120 performs a reset operation. The timing diagram of the electronic device 100 may include multiple reset periods (such as, each reset periods can be considered as the reset period P1). Therefore, it is not intended to limit the present disclosure.

As shown in FIG. 2, the host control circuit 110 transmits the commands CIS, CSO, CIW and CDO through the mobile industry processor interface MIPI to the touch with display driver integration circuit 120. The commands CIS, CSO, CIW and CDO are respectively to instruct the touch with display driver integration circuit 120 to perform initial setting, wake-up, image setting and to supply power to the display driving circuit 122. In some embodiments, the commands CIS, CSO, CIW and CDO are commands included in the display command set.

During the initial process S1, the host control circuit 110 provides the first supply voltage VDDIO and the second supply voltage VCI at the first logic level (such as, the high logic level) to the display driving circuit 122 and the touch driving circuit 124 for the electronic device 100 to perform the initial process.

During the initial process S1, the host control circuit 110 sequentially provides the first supply voltage VDDIO, the second supply voltage VCI and the first reset control signal Global_RST switched from the second logic level (such as, the low logic level) to the first logic level (such as, the high logic level), such that the electronic device 100 performs the initial process.

And, during the initial process S1, the display driving circuit 122 reads the firmware program form the memory 130 to perform the reset operation. As shown in FIG. 2, during the initial process S1, the read current RC has a high level.

Meanwhile, since the enable signal DSTB_EN has the low logic level, the logic circuit 126 generates the second reset control signal TP_RST according to the logic level of the first reset control signal Global_RST, and the logic circuit 126 outputs the second reset control signal TP_RST to the touch driving circuit 124. As a result, during the initial process S1, the touch driving circuit 124 performs the reset operation according to a signal edge of the second reset control signal TP_RST which corresponds to a signal edge of the first reset control signal Global_RST.

During the initial process S1, the first reset control signal Global_RST and the second reset control signal TP_RST is switched from a low logic level to a high logic level, and the signal edge of the first reset control signal Global_RST and the second reset control signal TP_RST respectively trigger the display driving circuit 122 and touch driving circuit 124 to perform reset operations. When the touch driving circuit 124 performs the reset operation, the touch with display driver integration circuit 120 reads the firmware program form the memory 130 which will generates a read current RC with a large amplitude (such as, 3 mA). After the touch driving circuit 124 completes the reset operation, the touch driving circuit 124 provides the touch enable signal TP_INT switched from the low logic level to the high logic level, so as to perform the sensing functions.

During the reset period P1 in the active mode M1, the first reset control signal Global_RST has a low logic level. The display driving circuit 122 performs the reset operation according to the signal edge, such as, a rising edge, of the first reset control signal Global_RST. Then, the host control circuit 110 transmits the commands CSO, CIW and CDO through the mobile industry processor interface MIPI to the touch with display driver integration circuit 120 to instruct the touch with display driver integration circuit 120 to perform wake-up, image setting and to provide supply power to the display driving circuit 122, such that the display driving circuit 122 performs the reset operation. And, during the reset period P1, the signal edge of the second reset control signal TP_RST triggers the touch driving circuit 124 to perform the reset operation which may cause the read current RC with large amplitude.

During the reset period P1 in the active mode M1, when the touch driving circuit 124 performs the reset operation, the firmware program is read from the memory 130 and a read current RC with 3 mA is generated, as shown in FIG. 2. After the touch driving circuit 124 completes the reset operation, the touch driving circuit 124 provides the touch enable signal TP_INT switched from the low logic level to the high logic level, so as to perform the touch sensing functions.

In some embodiments, during the initial process S1, a time interval between rising edges of the first supply voltage VDDIO and the first reset control signal Global_RST can be 10 ms. A time interval between rising edges of the first reset control signal Global_RST and the touch enable signal TP_INT can be 50 ms. A time interval between a rising edge of the first reset control signal Global_RST and the command CIS can be 11 ms. A time interval between the command CSO to the command CDO can be greater than 50 ms.

During the initial process S1, a time interval between the command CDO and an initial time point of the active mode M1 can be greater than 30 ms. In some embodiments, in the active mode M1, a time interval between a rising edge of the first reset control signal Global_RST and the command CSO can be greater than 120 ms. To be noted that, the time length as shown in FIG. 2 are for examples. Therefore, it is not intended to limit the present disclosure.

Figure 3:
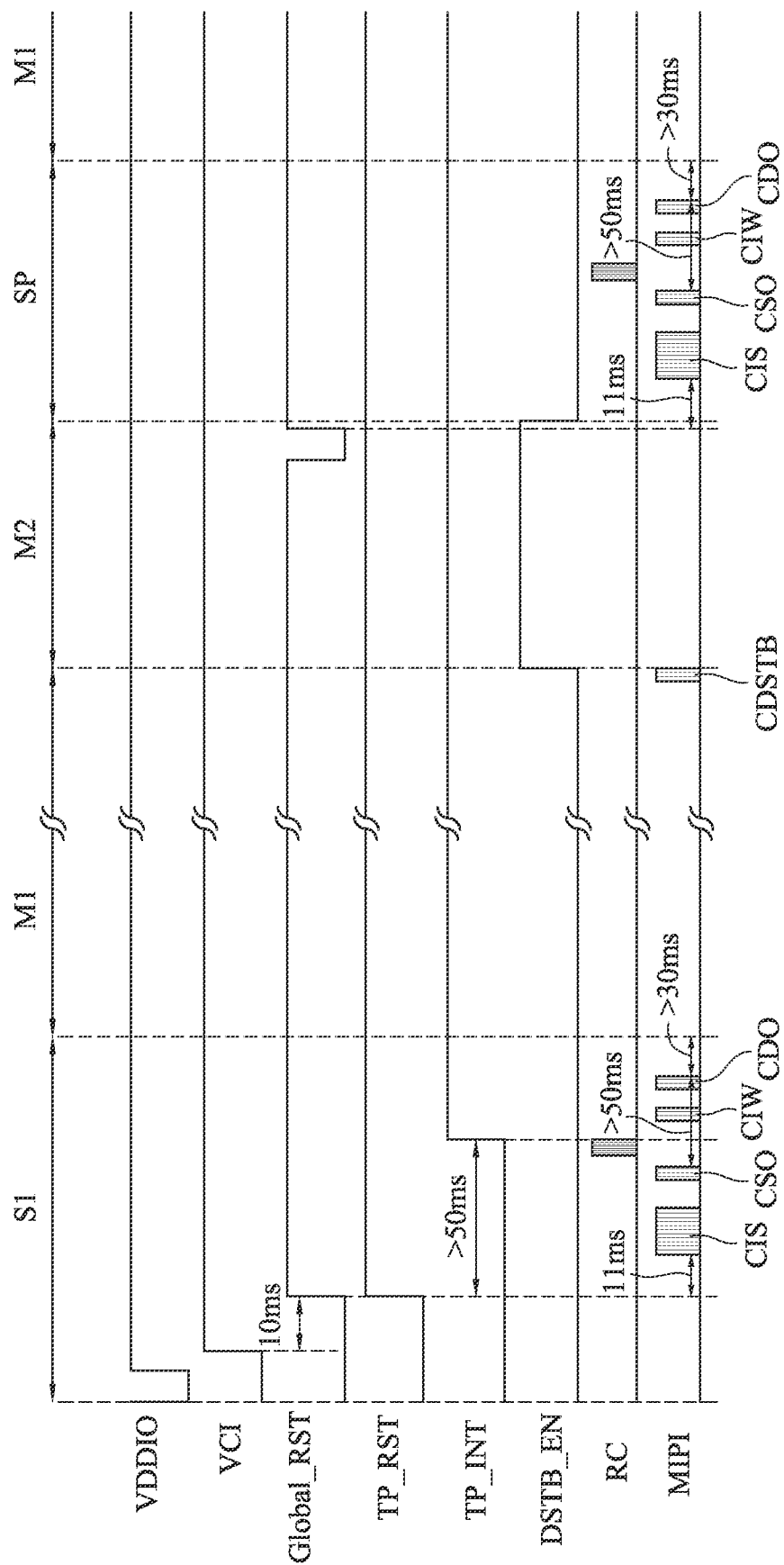
FIG. 3 is a schematic diagram of a timing diagram of the electronic device of the embodiment in FIG. 1 during an initial process, an active mode, a sleep mode and a switch period in accordance with one embodiment of the present disclosure.

For the better understanding, how to decrease the times to read the firmware program form the memory 130 when an operation mode of the electronic device 100 is switched between the active mode M1 and a sleep mode, in order to decrease the power consumption, reference is made to FIG. 3. FIG. 3 is a schematic diagram of a timing diagram of the electronic device 100 of the embodiment in FIG. 1 during an initial process S1, an active mode M1, a sleep mode M2 and a switch period SP in accordance with one embodiment of the present disclosure. In some embodiments, the sleep mode M2 can be implemented by a standby mode or a deep standby mode. Therefore, it is not intended to limit the present disclosure.

The initial process S1 and the active mode M1 as shown in FIG. 3 are respectively similar with the initial process S1 and the active mode M1 as shown in FIG. 2, and thus the description is omitted here. To be noted that, the time lengths as shown in FIG. 3 are for example, it is not intended to limit the present disclosure.

Before the end of the active mode M1 of the electronic device 100, the host control circuit 110 transmits the command CDSTB to the touch with display driver integration circuit 120 to instruct the touch with display driver integration circuit 120 enters into the sleep mode M2. Before the end of the sleep mode M2, a rising edge of the first reset control signal Global_RST triggers the display driving circuit 122 to perform the reset operation. And, during the switch period SP, the host control circuit 110 transmits the commands CSO, CIW and CDO to the touch with display driver integration circuit 120 to instruct the touch with display driver integration circuit 120 to perform the wake-up, image setting and provide the supply power to the display driving circuit 122, so as to switch the operation mode back to the active mode M1.

In the sleep mode M2, the enable signal DSTB_EN has the high logic level. In the sleep mode M2, in response to the enable signal DSTB_EN being at the high logic level, the logic circuit 126 generates the second reset control signal TP_RST at the high logic level, and the logic circuit 126 outputs/transmits the second reset control signal TP_RST to the touch driving circuit 124 to not reset the touch driving circuit 124, such that the times for reading the firmware program from the memory 130 can be rapidly decreased, and a large amount of the power consumption is reduced.

As a result, after the electronic device 100 enters the sleep mode M2, since the logic circuit 126 generates the second reset control signal TP_RST at the high logic level and outputs the second reset control signal TP_RST to the touch driving circuit 124, the touch driving circuit 124 will not perform the reset operation when the operation mode changes from the sleep mode M2 back to the active mode M1. As a result, when the operation mode frequently changes between the sleep mode M2 and the active mode M1, the read current RC generated by reading the firmware program form the memory 130 by the touch driving circuit 124 can be greatly reduced, so as to decrease the power consumption. And, since the logic circuit 126 is disposed in the touch with display driver integration circuit 120, the host control circuit 110 does not to provide the external control signal to the touch with display driver integration circuit 120, therefore the pins of the host control circuit 110 can be decreased and the cost can be reduced.

Figure 4:
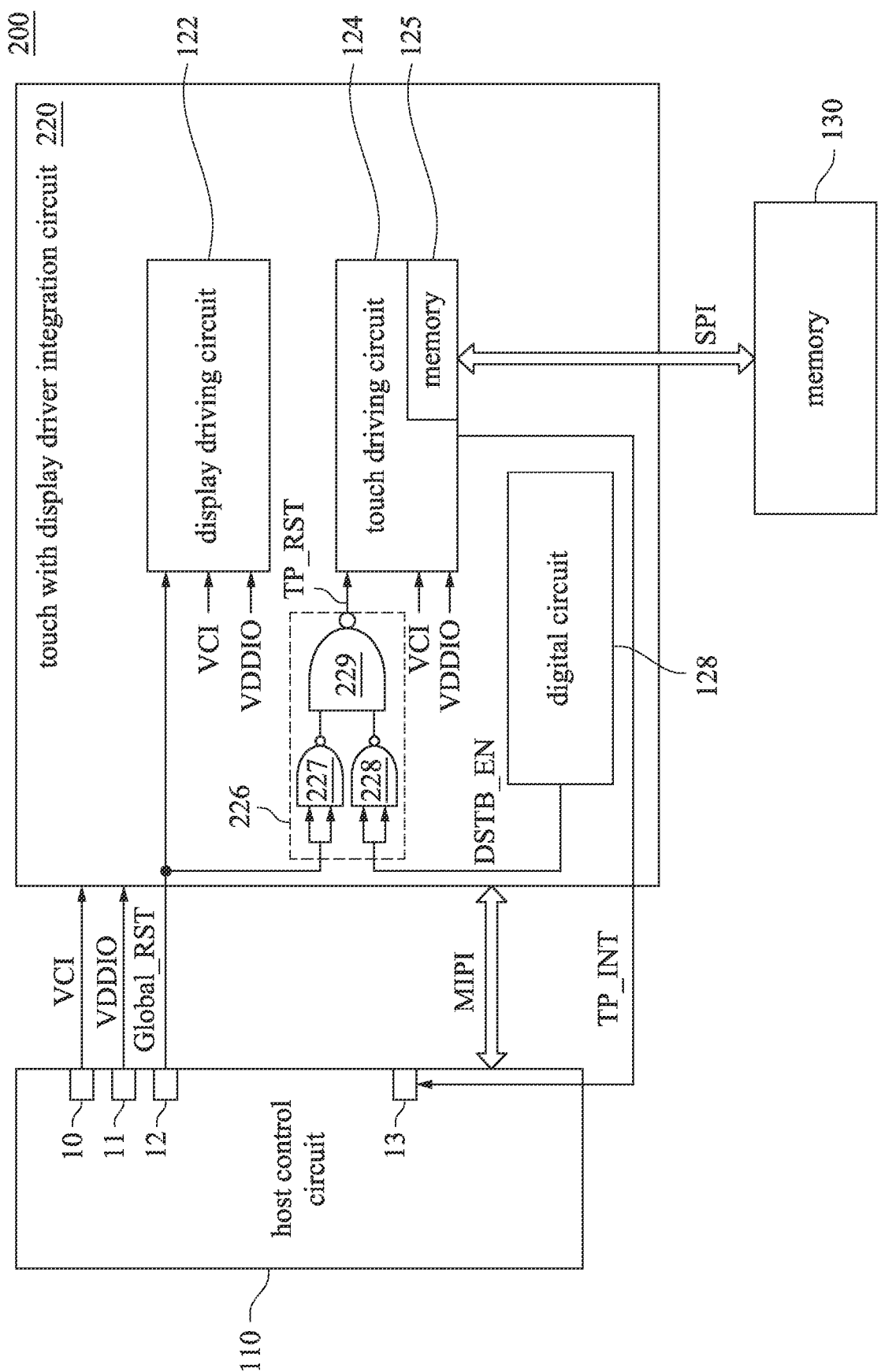
FIG. 4 is a schematic diagram of a function block of an electronic device in accordance with one embodiment of the present disclosure.

Reference is made to FIG. 4. FIG. 4 is a schematic diagram of a function block of an electronic device 200 in accordance with one embodiment of the present disclosure. As shown in FIG. 4, the electronic device 200 includes a host control circuit 110, a touch with display driver integration circuit 220 and a memory 130. The touch with display driver integration circuit 220 includes a display driving circuit 122, a touch driving circuit 124, a logic circuit 226 and a digital circuit 128.

Compare to the embodiment as shown in FIG. 1, the difference of the electronic device 200 as shown in FIG. 4 is that, the circuit architecture of the logic circuit 226. The logic circuit 226 includes a first NAND gate 227, a second NAND gate 228 and a third NAND gate 229.

In structure, two input terminals of the first NAND gate 227 are configured to receive the first reset control signal Global_RST. Two input terminals of the second NAND gate 228 are configured to receive the enable signal DSTB_EN. A first input terminal of the third NAND gate 229 is electrically coupled to an output terminal of the first NAND gate 227, a second input terminal of the third NAND gate 229 is electrically coupled to an output terminal of the second NAND gate 228, and an output terminal of the third NAND gate 229 is configured to output the second reset control signal TP_RST to the touch driving circuit 124.

In function, the logic circuit 226 generates the enable signal DSTB_EN, according to the first reset control signal Global_RST and the enable signal DSTB_EN, to the touch driving circuit 124.

Specifically, in response to one/at least one of the first reset control signal Global_RST and the enable signal DSTB_EN being at the high logic level, the logic circuit 226 outputs the second reset control signal TP_RST at the high logic level, and in response to both of the first reset control signal Global_RST and the enable signal DSTB_EN being at the low logic level, the logic circuit 226 outputs the second reset control signal TP_RST at the low logic level. The other elements and operation manner of the electronic device 200 are similar with the electronic device 100 in the embodiment as shown in FIG. 1. Therefore, the description is omitted here.

Figure 5:
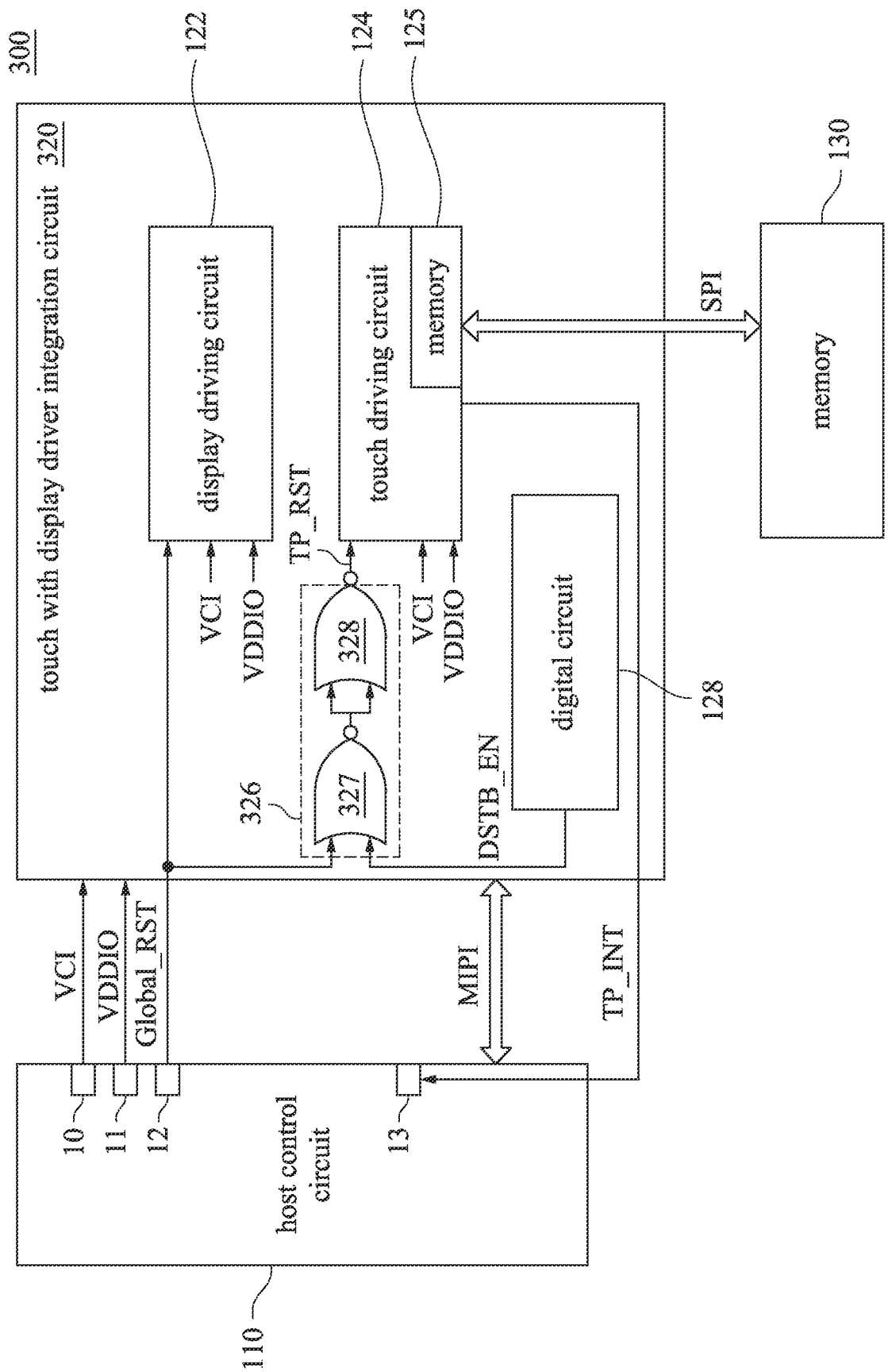
FIG. 5 is a schematic diagram of a function block of an electronic device in accordance with one embodiment of the present disclosure.

Reference is made to FIG. 5. FIG. 5 is a schematic diagram of a function block of an electronic device 300 in accordance with one embodiment of the present disclosure. As shown in FIG. 5, the electronic device 300 includes a host control circuit 110, a touch with display driver integration circuit 320 and a memory 130. The touch with display driver integration circuit 320 includes a display driving circuit 122, a touch driving circuit 124, a logic circuit 326 and a digital circuit 128.

Compare to the embodiment of FIG. 1, the difference of the electronic device 300 as shown in FIG. 5 is that, the circuit architecture of the logic circuit 326. The logic circuit 326 includes a first NOR gate 327 and a second NOR gate 328.

In structure, a first input terminal of the first NOR gate 327 is configured to receive the first reset control signal Global_RST, a second input terminal of the first NOR gate 327 is configured to receive the enable signal DSTB_EN. Two input terminals of the second NOR gate 328 are electrically coupled to an output terminal of the first NOR gate 327, and an output terminal of the second NOR gate 328 is configured to output the second reset control signal TP_RST to the touch driving circuit 124.

In function, the logic circuit 326 generates the second reset control signal TP_RST, according to the first reset control signal Global_RST and the enable signal DSTB_EN, to the touch driving circuit 124.

Specifically, in response to one/at least one of the first reset control signal Global_RST and the enable signal DSTB_EN being at a high logic level, the logic circuit 326 outputs the second reset control signal TP_RST at the high logic level, and in response to that both of the first reset control signal Global_RST and the enable signal DSTB_EN being at the low logic level, the logic circuit 326 outputs the second reset control signal TP_RST at the low logic level. The other elements and operation manner of the electronic device 300 are similar with the electronic device 100 of the embodiments as shown in FIG. 1. Therefore, the description is omitted here.

Summary, after the electronic devices 100, 200 and 300 enter the sleep mode M2, the logic circuits 126, 226 and 326 generate the second reset control signal TP_RST at the high logic level to the touch driving circuit 124, such that the touch driving circuit 124 does not perform the reset operation during the operation mode of the electronic devices 100, 200 and 300 switched from the sleep mode M2 to the active mode M1. As a result, when the operation mode of the electronic devices 100, 200 and 300 frequently changes between the sleep mode M2 and the active mode M1, the read current for reading the firmware program by the touch driving circuit 124 from the memory 130 can be greatly reduced, so as to reduce the power consumption. And, the present disclosure utilizes the logic circuit 126, which is disposed in the touch with display driver integration circuit 120, to provide the second reset control signal TP_RST, instead of providing the external control signal by the host control circuit 110, so as to decrease the number of the pins disposed in the host control circuit 110 and the cost can be reduced.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electronic device, comprising:
   a host control circuit, configured to provide a first reset control signal;
   a display driving circuit, configured to perform a reset operation according to the first reset control signal;
   a touch driving circuit; and
   a logic circuit, configured to generate a second reset control signal to the touch driving circuit according to the first reset control signal and an enable signal,
   wherein in a sleep mode, a rising edge of the first reset control signal triggers the display driving circuit to perform the reset operation,
   and in the sleep mode, the enable signal has a first logic level, in response to the enable signal being at the first logic level, the logic circuit generates the second reset control signal at the first logic level, and wherein the touch driving circuit does not reset according to the second reset control signal at the first logic level.

2. The electronic device of claim 1, wherein, in response to one of the first reset control signal and the enable signal being at the first logic level, the logic circuit outputs the second reset control signal at the first logic level.

3. The electronic device of claim 2, wherein, in response to both of the first reset control signal and the enable signal being at a second logic level, the logic circuit outputs the second reset control signal at the second logic level.

4. The electronic device of claim 3, wherein, in an active mode, the enable signal has the second logic level, in response to the enable signal being at the second logic level, the logic circuit generates the second reset control signal according to the first reset control signal.

5. The electronic device of claim 4, wherein:
   in the active mode, the display driving circuit is triggered to perform the reset operation according to signal edge of the first reset control signal; and
   in the active mode, the touch driving circuit is triggered according to signal edge of the second reset control signal.

6. The electronic device of claim 1, wherein the display driving circuit, the logic circuit and the touch driving circuit are disposed in a touch with display driver integration circuit.

7. The electronic device of claim 6, wherein the host control circuit comprises a pin, and wherein the host control circuit transmits the first reset control signal through the pin to the display driving circuit and the logic circuit.

8. The electronic device of claim 1, further comprising:
   a digital circuit, configured to generate the enable signal according to status value of operation mode of the electronic device.

9. The electronic device of claim 1, wherein the logic circuit comprises:
   a OR gate, wherein a first input terminal of the OR gate is configured to receive the first reset control signal, wherein a second input terminal of the OR gate is configured to receive the enable signal, and wherein an output terminal of the OR gate is configured to output the second reset control signal to the touch driving circuit.

10. The electronic device of claim 1, wherein the logic circuit comprises:
    a first NAND gate, wherein two input terminals of the first NAND gate are configured to receive the first reset control signal;
    a second NAND gate, wherein two input terminals of the second NAND gate are configured to receive the enable signal; and
    a third NAND gate, wherein a first input terminal of the third NAND gate is electrically coupled to an output terminal of the first NAND gate, wherein a second input terminal of the third NAND gate is electrically coupled to an output terminal of the second NAND gate, and wherein an output terminal of the third NAND gate is configured to output the second reset control signal to the touch driving circuit.

11. The electronic device of claim 1, wherein the logic circuit comprises:
    a first NOR gate, wherein a first input terminal of the first NOR gate is configured to receive the first reset control signal, wherein a second input terminal of the first NOR gate is configured to receive the enable signal; and
    a second NOR gate, wherein two input terminals of the second NOR gate are electrically coupled to an output terminal of the first NOR gate, and wherein an output terminal of the second NOR gate is configured to output the second reset control signal to the touch driving circuit.

12. An electronic device, comprising:
a host control circuit, configured to provide a first reset control signal; and
a touch with display driver integration circuit, comprising:
a display driving circuit, configured to perform reset operation according to the first reset control signal;
a touch driving circuit; and
a logic circuit, configured to generate a second reset control signal, according to the first reset control signal and an enable signal, to the touch driving circuit,
wherein in a sleep mode of the electronic device, a rising edge of the first reset control signal triggers the display driving circuit to perform the reset operation,
and in the sleep mode, the enable signal has a first logic level, wherein in response to the enable signal has the first logic level, the logic circuit generates the second reset control signal at the first logic level, and wherein the touch driving circuit does not reset according to the second reset control signal at the first logic level.

13. A control method, comprising:
providing a first reset control signal by a host control circuit;
providing an enable signal by a digital circuit;
in an active mode, generating and outputting a second reset control signal to a touch driving circuit, by a logic circuit, according to logic level of the first reset control signal, and resetting the logic circuit according to the second reset control signal corresponding to the logic level of the first reset control signal;
in a sleep mode, triggering a display driving circuit to perform reset operation according to a rising edge of the first reset control signal; and in the sleep mode, generating and outputting the second reset control signal to the touch driving circuit, by the logic circuit, according to logic level of the enable signal.

14. The control method of claim 13, further comprising:
in response to one of the first reset control signal and the enable signal being at a first logic level, outputting the second reset control signal at the first logic level by the logic circuit.

15. The control method of claim 14, wherein in the sleep mode, the enable signal has the first logic level, and wherein the control method further comprising:
in response to the enable signal at the first logic level, generating the second reset control signal at the first logic level, by the logic circuit.

16. The control method of claim 15, further comprising:
in the sleep mode, transmitting the second reset control signal at the first logic level to the touch driving circuit, by the logic circuit, to not reset the touch driving circuit.

17. The control method of claim 14, further comprising:
in response to both of the first reset control signal and the enable signal being at a second logic level, outputting the second reset control signal at the second logic level by the logic circuit.

18. The control method of claim 17, wherein in the active mode, the enable signal has a second logic level, and wherein the control method further comprising:
in response to the enable signal at the second logic level, generating the second reset control signal according to the first reset control signal, by the logic circuit.

19. The control method of claim 18, further comprising:
in the active mode, triggering the touch driving circuit to perform reset operation according to signal edge of the second reset control signal.

20. The control method of claim 13, further comprising:
in the active mode, triggering the display driving circuit to perform reset operation according to signal edge of the first reset control signal.

* * * * *